United States Patent [19]

Hanrahan et al.

[11] Patent Number: 5,598,317

[45] Date of Patent: Jan. 28, 1997

[54] LASER PATTERNED SEMICONDUCTOR CAPACITOR

[75] Inventors: Ciaran Hanrahan, Fremont; Andrew P. Stack, San Jose, both of Calif.

[73] Assignee: Integrated Device Technology, Inc., Santa Clara, Calif.

[21] Appl. No.: 597,785

[22] Filed: Feb. 7, 1996

Related U.S. Application Data

[62] Division of Ser. No. 94,676, Jul. 20, 1993.
[51] Int. Cl.⁶ .............................. H01G 4/005; H01G 4/06
[52] U.S. Cl. ............................................ 361/313; 361/303
[58] Field of Search ................ 361/311–313, 321.1, 361/321.2, 321.3, 321.4, 321.5, 301.1, 306.1–306.3, 303; 219/121.68, 121.69, 121.6; 29/25.42

[56] References Cited

U.S. PATENT DOCUMENTS 5,187,637  2/1993  Embree ................................ 361/313
5,355,277 10/1994  Hoshiba ................................ 361/313

*Primary Examiner*—Bot L. Ledynh
*Attorney, Agent, or Firm*—Skjerven, Morrill, MacPherson, Franklin & Friel

[57] ABSTRACT

A semiconductor capacitor used to test for contaminants in a fabrication line is created by: forming a layer of insulating material on a semiconductor substrate, forming a layer of conductive thin film on the layer of insulating material, and laser patterning an area of the conductive thin film. Laser patterning is performed by applying the laser along the outer boundary of the area to be patterned to energetically remove the conductive thin film along this boundary.

9 Claims, 7 Drawing Sheets

C-V RESULTS

| Probe # | Status | $C_{max}$ pF | $C_{min}$ pF | $C_{min}/C_{max}$ | $C_{flat-band}/C_{max}$ | DIAMETER Microns |
|---|---|---|---|---|---|---|
| 1 | 0 | 422.80 | 93.32 | 0.221 | 0.649 | 1260.3 |

| DOPING $cm^{-3}$ | $V_{flat-band}$ volts | SHIFT 0 to + | SHIFT 0 to + | $Q_{migration}$ | $Q_{surface-state}$ | Resistance Ohms |
|---|---|---|---|---|---|---|
| 6.19E+14 | 0.051 | 0.005 | -0.278 | 1.16E+09 | -3.70E+10 | 89.9 |

Status Code: 0 -OK, 1 -LEAKY DEVICE, 2 -BAD CONTACT, 3 -BAD $C_{flat-band}$, 4 -HOT CHUCK FALIURE

FIG. 7

LASER PATTERNED SEMICONDUCTOR CAPACITOR

This application is a division of application Ser. No. 08/094,676, filed Jul. 20, 1993.

FIELD OF THE INVENTION

This invention relates to the laser patterning of a conductive thin film in a semiconductor device. Such a conductive thin film can include metals, conductively doped polysilicon and metal silicides.

DESCRIPTION OF THE PRIOR ART

Patterned areas of conductive thin film have previously been used to create semiconductor devices such as capacitors. A semiconductor capacitor can be fabricated by forming an insulating layer on a silicon substrate and then forming an area of thin conductive material on top of the insulating layer. This area of thin conductive material is known as a capacitance-voltage (C-V) dot. Silicon dioxide is a commonly used insulating material, while typical thin conductive materials include conductively doped polysilicon, metals and metal silicides.

When a voltage is applied to the C-V dot, the device acts as a capacitor. That is, charge carrying particles are forced across the insulating layer such that the substrate contains a majority of charges having one polarity and the C-V dot contains a majority of charges having the opposite polarity. For this to occur, the C-V dot must be separated from the substrate by the insulating layer.

One application of a C-V dot is the detection of contaminants, such as sodium, in a wafer fabrication line. As a method of qualifying a diffusion furnace or other production equipment for volume production usage, a layer of uncontaminated oxide is formed on a wafer. The wafer is then run through the production equipment to be qualified so that the wafer is exposed to any contaminants present. Any contaminants introduce charge-carrying mobile ions into the wafer. A C-V dot is formed on the oxide by depositing metal through a mask or by using a photolithographic method to etch an area of deposited metal. A voltage supply is then connected to the C-V dot, and the applied voltage is cycled between preselected maximum and minimum voltages. The capacitance is measured for the varying voltages. These measurements are used to produce a capacitance-voltage (C-V) plot, such as the one shown in FIG. 1. Curve I in FIG. 1 shows the response of an ideal uncontaminated capacitor as the applied voltage is cycled between −5 volts and 5 volts.

The charge-carrying mobile ions present in a contaminated capacitor will cause the capacitance to change. This is because the extra charge carriers present in the wafer allow charge to flow more freely when the applied voltage is one polarity and less freely when the applied voltage is the opposite polarity. Such a change in capacitance is illustrated by the offset 3 in curve 2 of FIG. 2. The presence of offset 3 therefore indicates the presence of contaminants in the production equipment.

Conductive thin films in semiconductor devices have previously been patterned by using one of two methods. In one method, an area of conductive thin film is patterned by depositing the thin film material through an opening in a metal mask physically attached to the wafer surface. However, this method has several undesirable characteristics. First, the metal mask may be very difficult to attach to the wafer or load into the metal deposition system. Additionally, scratches, particle contamination, and chemical contamination may be introduced when attaching the metal mask to the wafer. Another drawback is that the metal mask may only be used several times before it must be thrown away. Also, if contamination of the metal mask occurs, subsequent wafers can be contaminated. Finally, the metal mask may fall off the wafer during metal deposition causing wafer breakage and/or downtime of the metal deposition system.

In the other method, an area of conductive thin film is patterned using photolithography. First, an area of conductive thin film larger than the desired patterned area is deposited on an upper surface of a semiconductor device. A layer of photoresist is deposited on the upper surface of the conductive thin film layer. The photoresist layer is then selectively exposed to ultraviolet light through a metal photomask having opaque and transparent areas in the shape of the desired pattern. Depending on whether the photoresist is positive or negative type, either the exposed photoresist portions or the unexposed portions are removed with a developer solution, leaving a mask which covers the desired patterned area of conductive thin film. An etchant, which removes the conductive thin film around the desired patterned area, is then applied to the upper surface of the photoresist layer. The photoresist layer is then removed, leaving the desired patterned area of conductive thin film.

This method is undesirable since it requires many processing steps and introduces risk of contamination during each of these steps. For these reasons, photolithographic methods for creating patterned areas of conductive thin film are not commonly used.

It would therefore be highly desirable to have a simple method for creating patterned areas of conductive thin film which reduces the risk of contamination and eliminates the need for a metal mask or photolithography.

SUMMARY OF THE INVENTION

The present invention provides such a method for patterning a conductive thin film.

It is one object of the present invention to reduce the risk of contamination when creating a patterned conductive thin film.

It is another object of the present invention to provide improved accuracy in Creating a patterned conductive thin film.

It is a further object of the present invention to eliminate the need for consumable metal masks in creating a patterned conductive thin film.

It is still another object of the present invention to eliminate the possibility of downtime of a metal deposition system in creating a patterned conductive thin film.

In accordance with the present invention, a layer of insulating material is formed on a semiconductor substrate. A layer of conductive thin film is formed on top of this insulating material. A laser is then used to pattern a closed area of the conductive thin film by energetically removing the conductive thin film along the boundary of the desired area, thereby creating a semiconductor capacitor.

BRIEF DESCRIPTION OF THE DRAWINGS

FIG. 7 is a summary of the measurements shown in the Capacitance-Voltage plot of FIG. 6;

DETAILED DESCRIPTION OF THE INVENTION

The present invention involves the patterning of thin layers of conductive material in a semiconductor device using a laser.

Figure 1:
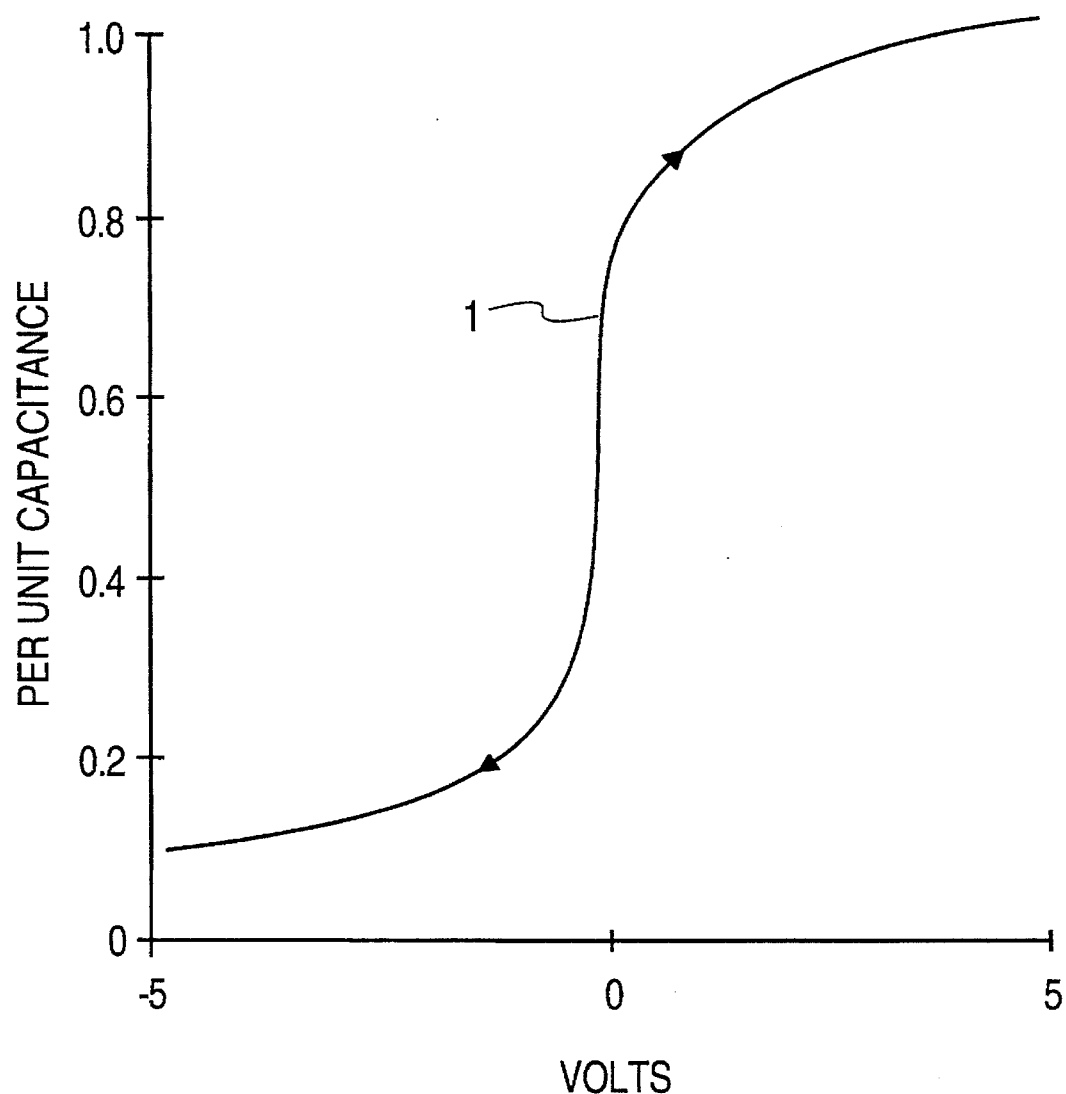
FIG. 1 is a Capacitance-Voltage plot for an ideal uncontaminated semiconductor capacitor.
Figure 2:
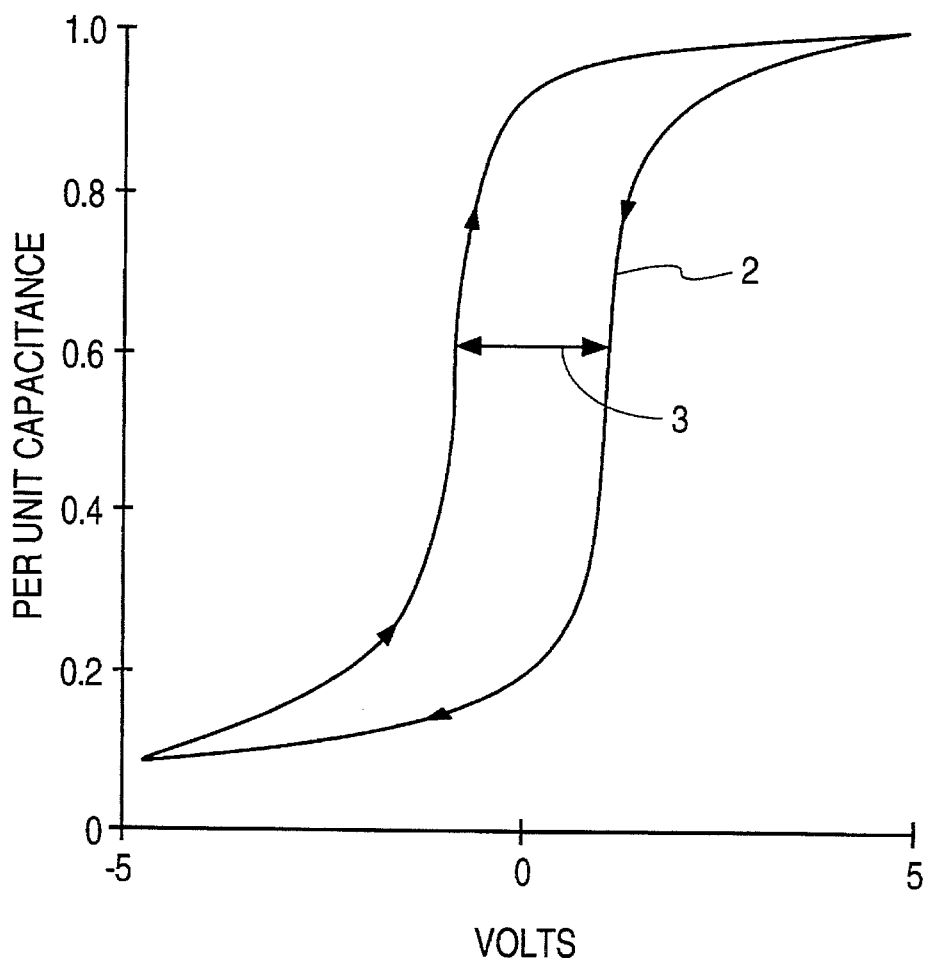
FIG. 2 is a Capacitance-Voltage plot for a contaminated semiconductor capacitor.
Figure 3:
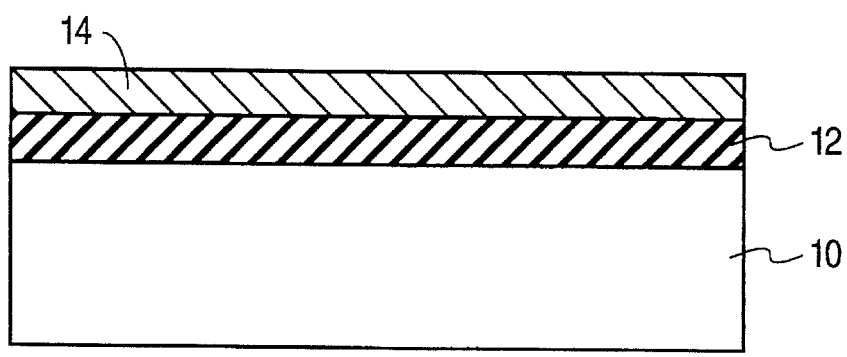
FIG. 3 is a cross section of a semiconductor capacitor before laser patterning.

In one embodiment of the present invention, a laser is used to pattern a thin layer of conductive material to create a C-V dot. FIG. 3 shows a cross section of a monocrystalline semiconductor substrate 10, an insulating layer 12, and a conductive thin film 14, prior to patterning. The semiconductor substrate 10 and insulating layer 12 are typically silicon and silicon dioxide, respectively. The conductive thin film 14 is typically metal, conductively doped polysilicon or a metal silicide. When used to test for contaminants in a fabrication line, the previously described structure is created as follows. The insulating layer 12 is formed on the semiconductor substrate 10. This structure is then run through the fabrication, thereby exposing the insulating layer 12 to any contaminants present. The conductive thin film 14 is deposited on the insulating layer 12 and the conductive thin film 14 is annealed. The annealing process may cause contaminants present in the insulating layer 12 to migrate to the interface between the insulating layer 12 and the semiconductor substrate 10.

A programmable beam laser, such as the Waferlase Wafer Marking System available from AB lasers (affiliated with Alltec GmbH and Baasel Laser Technology GmbH) is used to pattern the conductive thin film 14. The Waferlase Wafer Marking System uses a solid state diode pumped yttrium-aluminum-garnet (YAG) laser with a beam size of 20 micrometers, a maximum power of 1.5 watts, a wavelength of 1064 nanometers and a line width of approximately 0.1 millimeters. Other lasers, such as an excimer laser, may also be used.

The laser is programmed so that the beam will trace the desired shape of the patterned area on the surface of the conductive thin film. This shape may need to be programmed into the laser in consecutive segments. For example, in the absence of a program for patterning a circle, several programmable arcs may be used to create a circular pattern.

Figure 4:
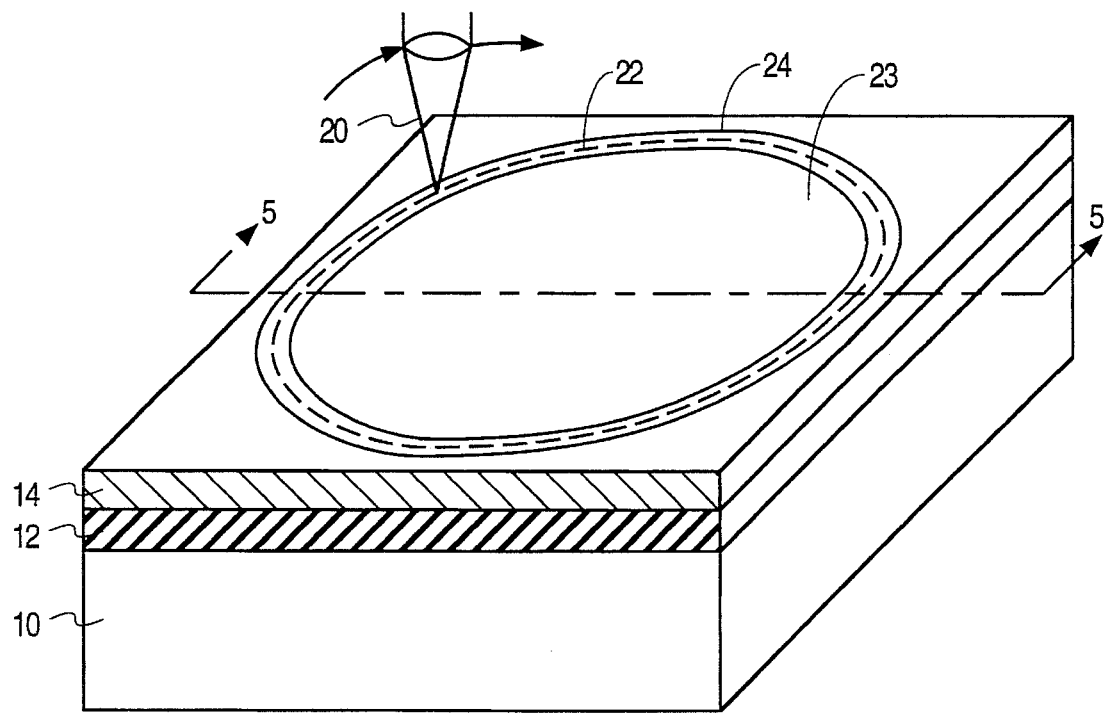
FIG. 4 is a perspective view of a semiconductor capacitor after laser patterning has been performed to create a Capacitance-Voltage dot.
Figure 5:
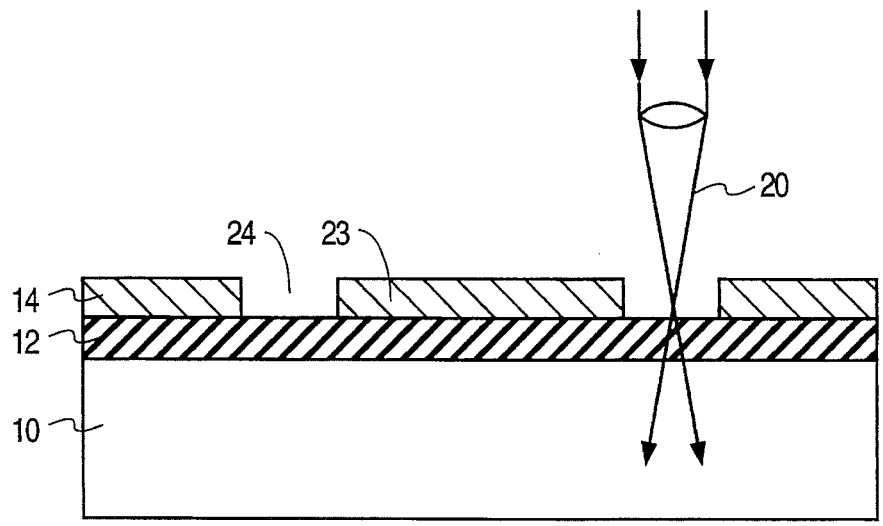
FIG. 5 is a cross section of the layers shown in FIG. 4 along sectional line 5—5.

FIGS. 4 and 5 illustrate the lasing process. The programmed laser creates a beam 20 which is focused on the conductive thin film 14. The focused laser beam 20 is cycled along outer boundary 22 to evaporate the conductive thin film 14 to create channel 24 and isolate patterned area 23. By repeatedly cycling the laser along the outer boundary 22, the deposition of conductive thin film 14 into channel 24 is substantially inhibited. After the channel 24 has been created, the laser is turned off. This may be done automatically by the patterning program after a predetermined number of cycles or manually by an operator who observes the conductive thin film 14 to determine when an appropriate amount of the conductive thin film 14 has been removed. No particular atmosphere is required during the lasing process.

Ideally, only the conductive thin film 14 will be removed when creating a C-V dot. While inadvertent removal of the insulating material along the bottom of channel 24 may occur, this will not prevent the capacitive structure from functioning properly. If the thickness of insulating layer 12 is completely removed along the bottom of channel 24, the laser beam may inadvertently remove a small portion of the underlying silicon in substrate 10. However, the amount of silicon removed will not be substantial because silicon has a high transmittance which allows the laser beam to pass through and because the laser beam loses focus when it reaches the substrate 10.

Figure 6:
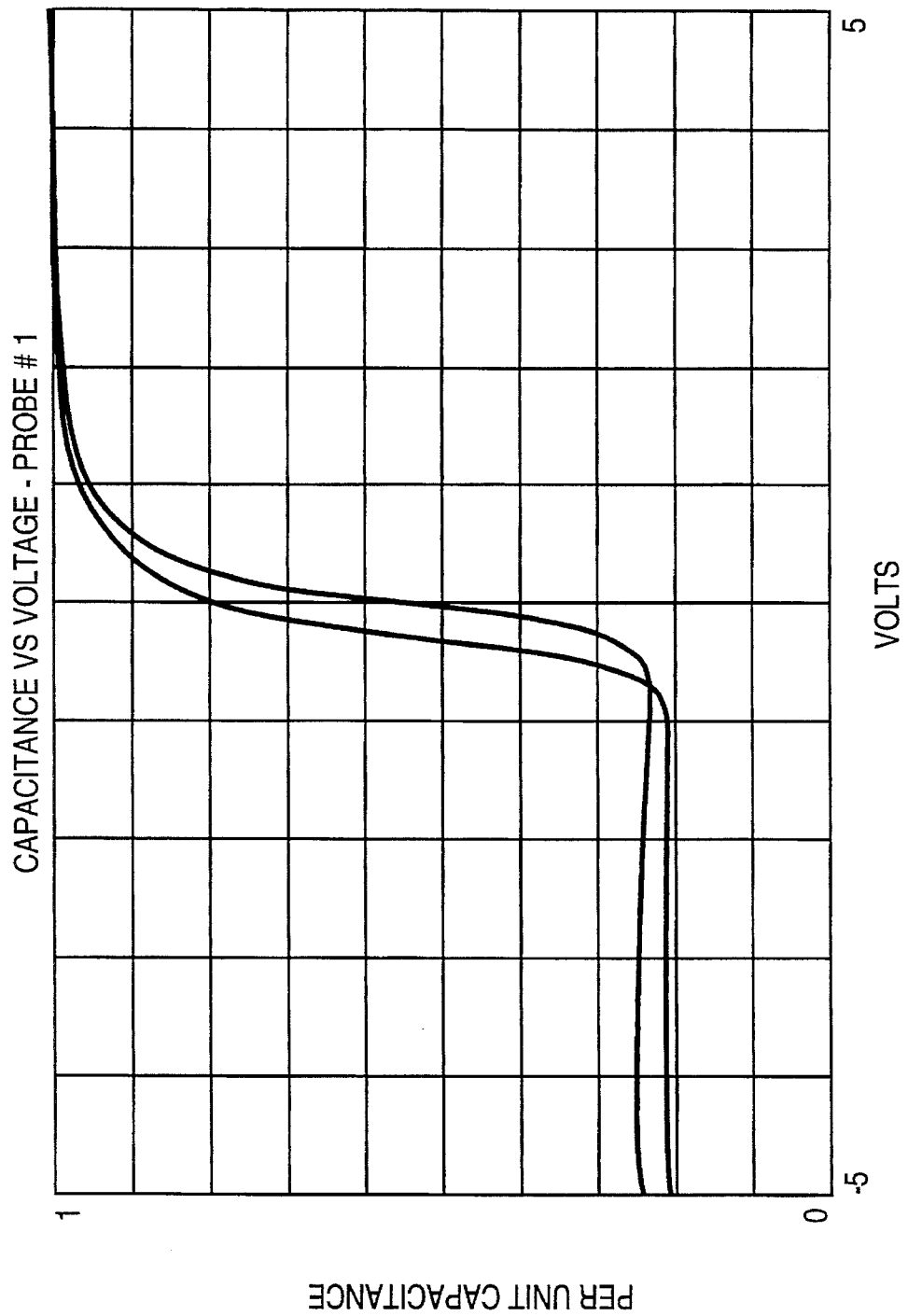
FIG. 6 is a Capacitance-Voltage plot for a laser patterned C-V dot.

FIG. 6 shows a C-V plot for a capacitor created using the method previously described. This capacitor comprises a silicon substrate, an insulating layer of 1000 Å of silicon dioxide and a circular aluminum alloy (1% Si, ½% Cu) C-V dot with a diameter of 1260 microns. FIG. 7 summarizes the measured parameters of this C-V dot.

Figure 8:
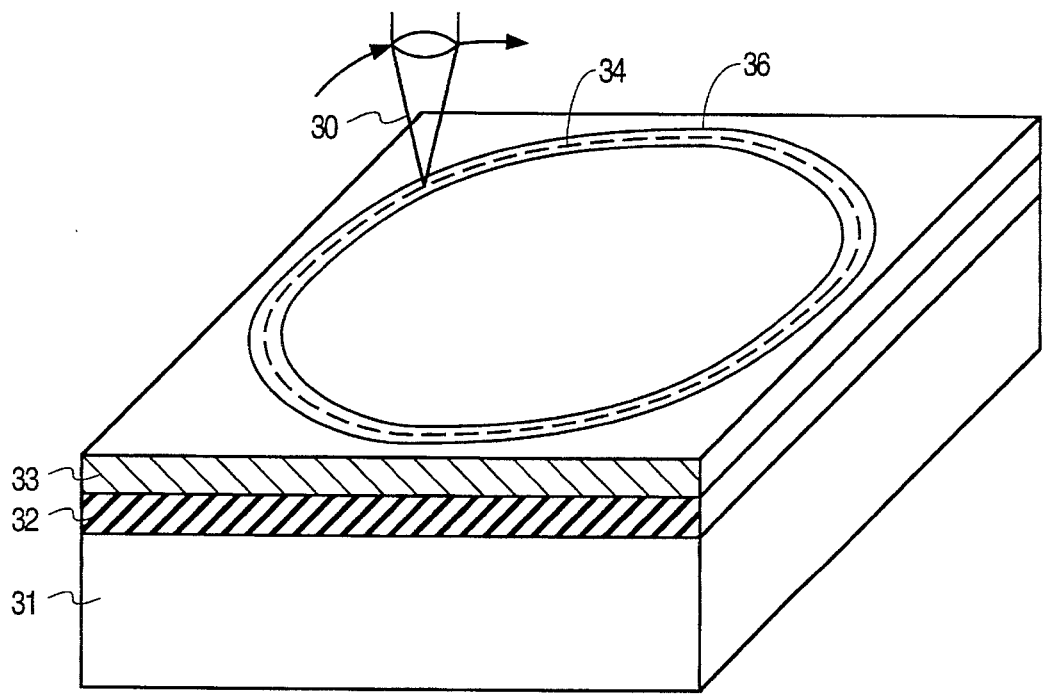
FIGS. 8 and 9 are perspective views showing processing steps of an alternate embodiment of the present invention.
Figure 9:
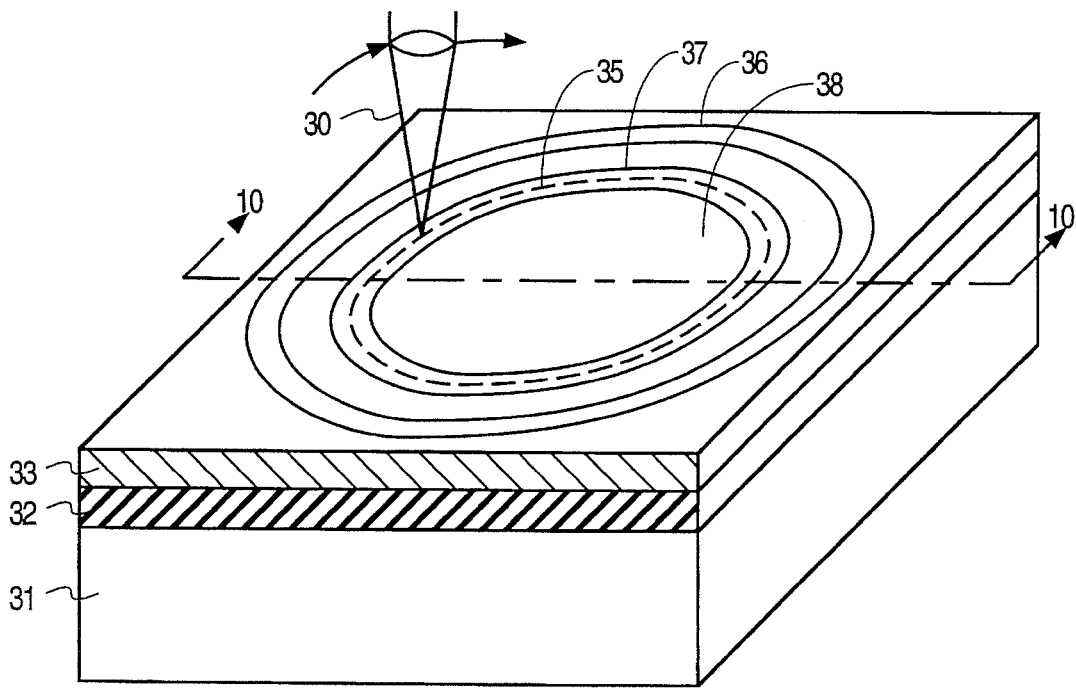
Figure 10:
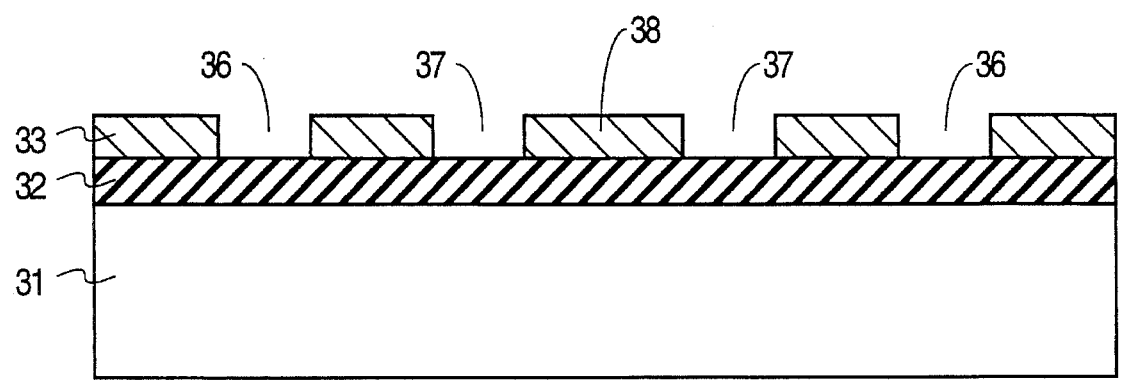
FIG. 10 is a cross section of the layers shown in FIG. 9 along sectional line 10—10.

An alternative embodiment of the present invention is shown in FIGS. 8 through 10. In this embodiment, a focused laser beam 30 is applied to a wafer consisting of a monocrystalline semiconductor substrate 31, an insulating layer 32 and a conductive thin film 33. Again, the semiconductor substrate 31 and insulating layer 32 are typically silicon and silicon dioxide, respectively. The conductive thin film 33 is typically metal, conductively doped polysilicon or a metal silicide. The laser beam is programmed to trace a first boundary 34 and a second boundary 35 on the conductive thin film 33. The laser beam 30 is applied to first boundary 34 to remove the conductive thin film 33 existing along this boundary and thereby form first channel 36. The laser beam 31 is then applied to second boundary 35 to remove the conductive thin film 33 along this boundary and thereby form second channel 37. The portion of conductive thin film located within second boundary 35 can be used as a C-V dot 38. This configuration provides for improved isolation and reduced leakage of the capacitive device. The second boundary 35 is patterned last to avoid the possibility of conductive thin film splashing into second channel during the patterning of first channel 36. Conductive material in the second channel 37 is undesirable since it may create a short circuit between the C-V dot 38 and the rest of the conductive thin film 33 or the semiconductor substrate 31.

While the invention has been described with reference to particular embodiments, this description is solely for the purpose of illustration and is not to be construed as limiting the scope of the invention. For example, the C-V dot may be shaped as a circle, square, or any variety of shapes by programming the path of the laser. Also, there may be more than one additional outer boundary area used to provide improved isolation the C-V dot. In addition, the same results may be obtained by moving the substrate rather than the laser beam. Various modifications and applications may be made by those skilled in the art without departing from the scope of the invention as defined in the following claims.

What is claimed is:

1. A semiconductor capacitor comprising:

a semiconductor substrate having an upper surface wherein the semiconductor substrate forms a first plate of the capacitor;

an insulating layer located over the upper surface of said substrate, the insulating layer having an upper surface, wherein the insulating layer extends over substantially the entire upper surface of the substrate; and an electrically conductive patterned thin film located over the upper surface of the insulating layer, the patterned thin film comprising a first patterned area which forms a second plate of the capacitor, a second patterned area which laterally surrounds said first patterned area and is electrically isolated from the first patterned area, and a third patterned area which laterally surrounds the second patterned area and is electrically isolated from the first and second patterned area, wherein the third patterned area extends over substantially the entire upper surface of the insulating layer.

2. The semiconductor capacitor according to claim 1, wherein said semiconductor capacitor is used to test for the presence of contaminants in a fabrication line.

3. The semiconductor capacitor of claim 1, wherein the first patterned area is a circle, and the second patterned area is a circular ring.

4. The semiconductor capacitor of claim 1, wherein the first patterned area and the second patterned area are electrically isolated by a first empty channel which extends through the thin film, and wherein the second patterned area and the third patterned area are electrically isolated by a second empty channel which extends through the thin film.

5. The semiconductor capacitor of claim 1, wherein the patterned thin film is formed by:

forming a conductive thin film over the entire upper surface of the insulating layer;

energetically removing a channel of the conductive thin film along a first closed boundary by applying a laser along the first closed boundary, wherein the first closed boundary defines an outer edge of the first patterned area and an inner edge of the second patterned area; and energetically removing a channel of the conductive thin film along a second closed boundary by applying a laser along the second closed boundary, wherein the second closed boundary defines an outer edge of the second patterned area and an inner edge of the third patterned area.

6. A semiconductor capacitor comprising:

a semiconductor substrate having an upper surface, wherein the semiconductor substrate forms a first plate of the capacitor;

an insulating layer located over the upper surface of said substrate, the insulating layer having an upper surface, wherein the insulating layer extends over substantially the entire upper surface of the substrate;

an electrically conductive patterned thin film located over the upper surface of the insulating layer, the patterned thin film having a first channel which extends through the thin film, the first channel having a closed boundary which defines an outer edge of a first patterned area of the thin film and an inner edge of a second patterned area of the thin film, wherein the first patterned area forms a second plate of the capacitor, the patterned thin film further having a second channel which extends through the thin film, the second channel laterally surrounding the first channel and defining an outer edge of the second patterned area of the thin film and an inner edge of a third patterned area of the thin film, wherein the third patterned area of the thin film extends substantially over the entire upper surface of the insulating layer.

7. The semiconductor capacitor of claim 6, wherein the first and second channels are empty.

8. The semiconductor capacitor of claim 6, wherein the patterned thin film is formed by:

forming a conductive thin film over the entire upper surface of the insulating layer;

forming the first channel by energetically removing a first portion of the conductive thin film using a laser; and forming the second channel by energetically removing a second portion of the conductive thin film using a laser.

9. The semiconductor capacitor of claim 6, wherein the first and second channels extend into the insulating layer.

\* \* \* \* \*